(12) United States Patent
Schlott et al.

(10) Patent No.: US 8,974,707 B2
(45) Date of Patent: Mar. 10, 2015

(54) PLANAR OR TUBULAR SPUTTERING TARGET AND METHOD FOR THE PRODUCTION THEREOF

(71) Applicant: Heraeus Materials Technology GmbH & Co. KG, Hanau (DE)

(72) Inventors: Martin Schlott, Offenbach (DE); Sabine Schneider-Betz, Dreieich (DE); Uwe Konietzka, Geiselbach (DE); Markus Schultheis, Flieden (DE); Ben Kahle, Alzenau (DE); Lars Ebel, Freigericht (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 13/845,594

(22) Filed: Mar. 18, 2013

(65) Prior Publication Data

US 2013/0264200 A1    Oct. 10, 2013

(30) Foreign Application Priority Data

Apr. 4, 2012 (DE) .......................... 10 2012 006 718

(51) Int. Cl.
| | |
|---|---|
| F21V 9/00 | (2006.01) |
| C23C 14/34 | (2006.01) |
| C22C 5/06 | (2006.01) |
| H01J 37/34 | (2006.01) |

(52) U.S. Cl.
CPC ............... *C23C 14/3414* (2013.01); *C22C 5/06* (2013.01); *H01J 37/3414* (2013.01); *H01J 37/3426* (2013.01)
USPC ........... 252/582; 148/431; 148/538; 164/493; 204/298.13

(58) Field of Classification Search
CPC ....... C23C 14/3414; C22C 5/06; G11B 7/257
USPC ................... 252/582; 148/431, 538; 164/493; 204/298.13
See application file for complete search history.

(56) References Cited

U.S. PATENT DOCUMENTS

| | | | |
|---|---|---|---|
| 6,139,652 A | 10/2000 | Carrano et al. | |
| 2004/0238356 A1 | 12/2004 | Matsuzaki et al. | |
| 2012/0193589 A1* | 8/2012 | Komiyama et al. ........... | 252/582 |

FOREIGN PATENT DOCUMENTS

| | | | | |
|---|---|---|---|---|
| JP | H09-256083 A | | 9/1997 | |
| JP | 2013-204052 A | | 10/2013 | |
| KR | 10-2004-0044481 A | | 5/2004 | |
| KR | 10-2011-0113214 A | | 10/2011 | |
| WO | WO 2011/043486 | * | 4/2011 | .............. C23C 14/06 |
| WO | 2013105284 A1 | | 7/2013 | |
| WO | 2013105285 A1 | | 7/2013 | |
| WO | 2013145424 A1 | | 10/2013 | |

OTHER PUBLICATIONS

Office Action issued Dec. 4, 2012 in DE Application No. 10 2012 006 718.6.
Iwanami Rikagaku Jiten Dai-5-han (a dictionary for physical and chemical terms, 5th edition) (English translation of relevant portion), 1998.

* cited by examiner

*Primary Examiner* — Khanh Tuan Nguyen
(74) *Attorney, Agent, or Firm* — Panitch Schwarze Belisario & Nadel LLP

(57) ABSTRACT

Planar or tubular sputtering targets made of a silver base alloy and at least one further alloy component selected from indium, tin, antimony, and bismuth accounting jointly for a weight fraction of 0.01 to 5.0% by weight are known. However, moving on to ever larger targets, spark discharges are evident and often lead to losses especially in the production of large and high-resolution displays having comparatively small pixels. For producing a sputtering target with a large surface area on the basis of a silver alloy of this type, which has a surface area of more than 0.3 m$^2$ as a planar sputtering target and has a length of at least 1.0 m as a tubular sputtering target, and in which the danger of spark discharges is reduced and thus a sputtering process with comparatively high power density is made feasible, the invention proposes that the silver base alloy has a crystalline structure with a mean grain size of less than 120 μm, an oxygen content of less than 50 wt.-ppm, a content of the impurity elements, aluminum, lithium, sodium, calcium, magnesium, barium, and chromium, each of less than 0.5 wt.-ppm, and a metallic purity of at least 99.99% by weight.

13 Claims, No Drawings

PLANAR OR TUBULAR SPUTTERING TARGET AND METHOD FOR THE PRODUCTION THEREOF

BACKGROUND OF THE INVENTION

The invention relates to a planar sputtering target having a surface area of more than 0.5 m² or a tubular sputtering target having a length of at least 1.0 m, each consisting of a silver base alloy and at least one further alloy component selected from indium, tin, antimony, and bismuth accounting jointly for a weight fraction of 0.01 to 5.0% by weight.

The invention also relates to a method for producing a planar sputtering target having a surface area of more than 0.3 m² or a tubular sputtering target having a length of at least 1.0 m from a silver base alloy, comprising melting an alloy having a nominal composition of silver and at least one further alloy component selected from indium, tin, antimony, and bismuth accounting jointly for a weight fraction of 0.01 to 5.0% by weight, casting the molten material into a mould and thus forming a form body from the silver base alloy, and reforming the form body into a sputtering target.

Sputtering targets of this type are used as cathode material for producing layers by means of high vacuum-based sputtering in tubular or planar design, such as, for example square targets or strip-shaped targets. Cathode sputtering is used, for example, to provide optical storage media or substrates with reflective or partially reflective layers during the production of liquid crystal displays or OLED displays.

A sputtering target for producing layers with high reflectivity in the visible spectral range is known from EP 1 489 193 A1. The target material consists of a silver alloy with additives accounting for 0.01-5.0% by weight, whereby at least one of the elements, indium, tin, antimony and/or bismuth, is present therein. Said material is characterised by its high resistance to corrosion and ambient conditions in sulphur-containing atmospheres.

The production usually involves melting an alloy and casting it into a mould, often followed by a reforming step such as forging, rolling or pressing.

BRIEF SUMMARY OF THE INVENTION

Along with the development of increasingly larger flat-panel screens, the surface area of sputtering targets is also increasing in size. Simultaneously, the requirements in terms of coating quality are also becoming more demanding, not only due to the larger surface area of the substrates, but also due to higher display resolutions which necessitate smaller pixels. Coating errors are basically unacceptable since they cause high expenditure of time and materials, which reduces the production output. Increasing the production rate through an increase in the power density during the sputtering process has its limits since splashes may be formed when the layers are deposited which is due to local spark discharging on the target which has also been called arcing or micro-arcing. Spark discharges cause the target material to melt locally such that small molten splashes of the target material can reach the substrate to be coated and produce defects in these sites that may impair the function of one or more pixels.

Spark discharges of this type often lead to losses especially in the production of large and high-resolution displays having comparatively small pixels.

The invention is therefore based on the object to provide a sputtering target with a large surface area on the basis of a silver alloy, which has a surface area of more than 0.3 m² as a planar sputtering target and has a length of at least 1.0 m as a tubular sputtering target, and in which the danger of spark discharges is reduced and thus a sputtering process with comparatively high power density is made feasible.

Moreover, the invention is also based on the object to specify a method for cost-efficient production of said sputtering target.

Along with the development of increasingly larger flat-panel screens, the surface area of sputtering targets is also increasing in size. Simultaneously, the requirements in terms of coating quality are also becoming more demanding, not only due to the larger surface area of the substrates, but also due to higher display resolutions which necessitate smaller pixels. Coating errors are basically unacceptable since they cause high expenditure of time and materials, which reduces the production output. Increasing the production rate through an increase in the power density during the sputtering process has its limits since splashes may be formed when the layers are deposited which is due to local spark discharging on the target which has also been called arcing or micro-arcing. Spark discharges cause the target material to melt locally such that small molten splashes of the target material can reach the substrate to be coated and produce defects in these sites that may impair the function of one or more pixels.

Spark discharges of this type often lead to losses especially in the production of large and high-resolution displays having comparatively small pixels.

The invention is therefore based on the object to provide a sputtering target with a large surface area on the basis of a silver alloy, which has a surface area of more than 0.3 m² as a planar sputtering target and has a length of at least 1.0 m as a tubular sputtering target, and in which the danger of spark discharges is reduced and thus a sputtering process with comparatively high power density is made feasible.

Moreover, the invention is also based on the object to specify a method for cost-efficient production of said sputtering target.

Said object is met according to the invention based on a sputtering target of the type specified above in that the silver base alloy has a crystalline structure with a mean grain size of less than 120 μm, an oxygen content of less than 50 wt.-ppm, a content of the impurity elements, aluminium, lithium, sodium, calcium, magnesium, barium, and chromium, each of less than 0.5 wt.-ppm, and a metallic purity of at least 99.99% by weight.

DETAILED DESCRIPTION OF THE INVENTION

The silver base alloy contains at least one of the elements, indium, tin, antimony and/or bismuth. It has been evident that a combination of several factors is essential for the spark discharge tendency of an alloy of this type, namely the content of oxygen and impurity elements, such as aluminium, lithium, sodium, calcium, magnesium, barium, and chromium as well as their structural grain size.

For the spark discharge tendency to be low, the alloy needs to have a low oxygen content of less than 50 wt.-ppm. However, due to production factors, sputtering targets contain a certain fraction of metal oxides which, in the case of silver base alloy, can originate, for example, from the silver grains used which often contain a certain fraction of oxygen. However, other metals with a high affinity for oxygen also contribute to the introduction of oxygen into the alloy, such as, for example, aluminium, lithium, sodium, calcium, magnesium, barium, and chromium. For this reason, the concentration of said metals in the silver base alloy according to the invention, as measured by means of GDMS, is limited to less than 0.5 wt.-ppm, preferably less than 0.1 wt.-ppm each.

Moreover, it has been evident that especially impurities with a high affinity for oxygen can be the cause of spark discharging such that it is advantageous according to the invention for the metallic purity of the silver base alloy to be 99.99% by weight or more.

Said high purity excludes impurities of any type from being present.

Aside from the composition of substances, the grain size of the crystalline structure has proven to be another decisive factor for the spark discharge tendency. This tendency is the lower, the finer the crystalline structure. Accordingly, the silver base alloy according to the invention is characterised through a mean grain size (as measured by means of the lineal intercept method ASTM E112) of less than 120 µm, preferably less than 100 µm. However, establishing very low grain sizes of less than 5 µm requires very high degrees of reforming and is therefore associated with much effort.

The oxygen content of the silver base alloy is as low as possible, preferably it is less than 20 ppm, particularly preferably less than 10 ppm.

A measure to achieve this is to prevent the presence of impurity elements with an affinity for oxygen mentioned above as much as possible, whose total content in the silver base alloy is therefore less than 0.5 ppm, preferably less than 0.1 ppm.

In terms of the method, the object specified above is met according to the invention in that, based on a method of the type specified above, the melting is effected by means of induction melting under reducing conditions while establishing an oxygen content of less than 50 wt.-ppm.

The starting components of the silver base alloy are present as highly pure metal forms of the corresponding components or in the form of pre-alloyed material. The content of each of the impurity elements with a high affinity for oxygen, such as aluminium, lithium, sodium, calcium, magnesium, barium, and chromium, is less than 0.5 wt.-ppm, preferably less than 0.1 wt.-ppm. The initial oxygen content of the starting components must be minimised and can be reduced further through reductive treatment prior to melting.

In the scope of the invention, it is essential though to establish reducing conditions during the process of melting. Said conditions can be generated through the presence of a substance with an affinity for oxygen in the melting atmosphere, the melting mould or the material to be melted. The oxygen affinity of said substance is higher than that of the alloy components of the silver base alloy such that it scavenges oxygen that is present. In this sense, "reducing" condition means that the substance with an affinity for oxygen acts as an oxygen scavenger during the entire melting process or at least during a phase of the melting process.

Induction melting prevents the introduction of oxygen and other impurities from combustion gases into the molten metal.

This allows the oxygen content of the silver base alloy to be reduced to less than 50 wt.-ppm, preferably less than 20 wt.-ppm.

In addition, the substance with an affinity for oxygen should not be introduced into the alloy. This can be attained most easily in that it is present as a gas or reacts with oxygen to form a gas that is insoluble or poorly soluble in the silver base alloy.

In this context, it has proven to be expedient to generate the reducing conditions by adding graphite.

Graphite reacts with oxygen to form carbon dioxide or carbon monoxide. Both gases can evaporate from the molten metal. Graphite can be added, e.g., as a powder whereby the amount must be designed such that it is fully consumed after completion of the melting process.

With regard to establishing the finest grain structure possible, the reforming of the form body made of the silver base alloy is done at a temperature in the range of 650 to 750° C. with dynamic recrystallisation of the crystalline structure and formation of a mean grain size of less than 120 µm.

EXAMPLES

In the following, the invention is illustrated in more detail on the basis of exemplary embodiments.

Test Results

Initially, several sputtering test targets were produced in test series' through induction melting of various silver base alloys that had the following designs and dimensions:

planar, strip-shaped targets with dimensions of 488 mm×88 mm and a surface area of 0.043 m², and tubular targets having a diameter of 155 mm and a length of 505 mm.

Table 1 summarises the chemical compositions of the test targets and the test results obtained with them. "VU" means the total content of the impurities: aluminium, lithium, sodium, calcium, magnesium, barium, and chromium.

The sputtering targets of tests 1 to 10 were produced through induction melting of highly pure alloy components and at different oxygen contents. In order to reduce the oxygen content, the molten metals of tests 2, 3, 5, 8, and 10 were subjected to deoxidation through the addition of graphite particles. Production of the Planar Test Targets After casting of the material melted through induction and subsequent cooling of the slabs thus obtained, raw strips of the target material with a length of 2.5 m were produced through hot rolling. A particularly fine metallic grain structure is obtained through reforming the slabs at temperatures of 650-750° C. through multiple tapping followed by cooling (dynamic recrystallisation). Subsequently, the planar sputtering test targets were cut from the strips.

Production of the Tubular Test Targets

For the production of the tubular test targets, cylinder-shaped slabs were produced through induction melting as described above. The slabs were subsequently drilled and reformed into tubes through extrusion. A distinction needs to be made in this respect between hot reforming and cold reforming. In hot reforming, like in hot rolling as described above, a particularly fine metallic grain structure is obtained through reforming the slabs at temperatures of 650-750° C. followed by cooling. Alternatively, cold reforming can be used, in which subsequent recrystallisation annealing in the range of 400-600° C. for 0.5 to 4 hours is required depending on the degree of reforming and the initial structure.

The targets thus obtained were used to perform sputtering tests under the following conditions: The sputtering pressure was 0.5 Pa. The planar sputtering targets were operated at a sputtering power of 7 W/cm² and the tubular sputtering targets were operated at a sputtering power of 15 kW/cm².

The mean grain size was determined through microscopy using surface grinding on the sputter side according to the lineal intercept method according to ASTM E112 on at least four randomly selected samples of a target.

The oxygen content was measured by hot gas extraction. The impurities were assayed using glow-discharge mass spectrometry (GDMS).

Moreover, the quality of the targets in terms of the incidence of micro-arcing and splashes was tested through analysis of the arcing monitor and optical assessment of test substrates. The micro-arcing and splashes results are assessed on a qualitative level in columns 7 and 8 of Table 1. The symbols used for assessment were as follows:

"++" very good,
"+" good,
"0" acceptable,
"−" poor, and
"−−" very poor.

TABLE 1

| Test No. | Composition (+ impurities) Remainder: Silver [wt.-ppm] | | Oxygen content [wt.-ppm] | Mean grain size [μm] | Metallic purity [%] | Result Micro-arcing | Splashes |
|---|---|---|---|---|---|---|---|
| 1 | In | 5,000 | 303 | 100 | 99.95 | − | −− |
|  | Al | 1 | | | | | |
|  | Mg | 2 | | | | | |
| 2 | In | 5,000 | 3 | 65 | 99.99 | + | ++ |
|  | Impurities | <0.5 | | | | | |
| 3 | In | 5,000 | 15 | 45 | 99.99 | ++ | + |
|  | Sn | 5,000 | | | | | |
|  | Impurities | <0.1 | | | | | |
| 4 | In | 5,000 | 30 | 150 | 99.99 | −− | −− |
|  | Sn | 5,000 | | | | | |
|  | Al | 1 | | | | | |
|  | Mg | 2 | | | | | |
| 5 | In | 10,000 | 19 | 50 | 99.99 | ++ | + |
|  | Impurities | <0.1 | | | | | |
| 6 | In | 10,000 | 220 | 50 | 99.95 | −− | −− |
|  | Mg | <0.1 | | | | | |
| 7 | In | 2,000 | 120 | 120 | 99.95 | 0 | − |
|  | Sb | 10,000 | | | | | |
|  | Al | 1 | | | | | |
|  | Mg | 2 | | | | | |
|  | Cr | <0.1 | | | | | |
| 8 | In | 2,000 | 11 | 75 | 99.99 | + | ++ |
|  | Sb | 10,000 | | | | | |
|  | Impurities | <0.5 | | | | | |
| 9 | In | 5,000 | 280 | 200 | 99.99 | −− | −− |
|  | Bi | 2,000 | | | | | |
|  | Mg | 10 | | | | | |
|  | Cr | 3 | | | | | |
| 10 | In | 5,000 | 7 | 80 | 99.99 | 0 | + |
|  | Bi | 2,000 | | | | | |
|  | Impurities | <0.5 | | | | | |

Good results were obtained only with sputtering targets, in which the crystalline structure had a mean grain size of less than 120 μm and the oxygen content was less than 50 wt.-ppm. An aluminium, lithium, sodium, calcium, magnesium, barium, and chromium content of more than 0.5 wt.-ppm in each case leads to poorer results.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A sputtering target comprising a silver base alloy and at least one further alloy component selected from indium, tin, antimony, and bismuth, wherein the at least one further alloy component is present in a total weight fraction of 0.01 to 5.0% by weight, and having a crystalline structure with a mean grain size of less than 120 μm, an oxygen content of less than 50 mg/kg, a content of the impurity elements, aluminum, lithium, sodium, calcium, magnesium, barium, and chromium, each of less than 0.5 mg/kg, and a metallic purity of at least 99.99% by weight, with the proviso that when the sputtering target is planar the target has a surface area of more than 0.3 $m^2$, and with the proviso that when the sputtering target is tubular the target has length of at least 1.0 m.

2. The sputtering target according to claim 1, wherein the oxygen content of the silver base alloy is less than 20 mg/kg.

3. The sputtering target according to claim 2, wherein the content of each of the impurity elements is less than 0.1 mg/kg.

4. The sputtering target according to claim 2, wherein the total content of the impurity elements is less than 0.5 mg/kg.

5. The sputtering target according to claim 2, wherein the total content of the impurity elements is less than 0.1 mg/kg.

6. The sputtering target according to claim 2, wherein the mean grain size is less than 100 μm.

7. The sputtering target according to claim 1, wherein the oxygen content of the silver base alloy is less than 10 mg/kg.

8. The sputtering target according to claim 1, wherein the content of each of the impurity elements is less than 0.1 mg/kg.

9. The sputtering target according to claim 7, wherein the mean grain size is less than 100 μm.

10. The sputtering target according to claim 1, wherein the total content of the impurity elements is less than 0.5 mg/kg.

11. The sputtering target according to claim 10, wherein the mean grain size is less than 100 μm.

12. The sputtering target according to claim 1, wherein the total content of the impurity elements is less than 0.1 mg/kg.

13. The sputtering target according to claim 1, wherein the mean grain size is less than 100 μm.

\* \* \* \* \*